US007358490B1

(12) United States Patent
Hersam et al.

(10) Patent No.: US 7,358,490 B1
(45) Date of Patent: Apr. 15, 2008

(54) METHODS AND APPARATUS OF SPATIALLY RESOLVED ELECTROLUMINESCENCE OF OPERATING ORGANIC LIGHT-EMITTING DIODES USING CONDUCTIVE ATOMIC FORCE MICROSCOPY

(75) Inventors: Mark C. Hersam, Evanston, IL (US); Liam S. C. Pingree, Chicago, IL (US)

(73) Assignee: Northwestern University, Evanston, IL (US)

( * ) Notice: Subject to any disclaimer, the term of this patent is extended or adjusted under 35 U.S.C. 154(b) by 296 days.

(21) Appl. No.: 11/138,148

(22) Filed: May 26, 2005

Related U.S. Application Data

(60) Provisional application No. 60/575,653, filed on May 28, 2004.

(51) Int. Cl.
*G01N 23/00* (2006.01)
(52) U.S. Cl. ........................ 250/306; 977/851
(58) Field of Classification Search ................ 250/306, 250/307, 308, 368; 977/851
See application file for complete search history.

(56) References Cited

U.S. PATENT DOCUMENTS

| 5,672,816 A * | 9/1997 | Park et al. ............. 73/105 |
| 2004/0190134 A1* | 9/2004 | Tahara et al. ............. 359/386 |
| 2005/0036655 A1* | 2/2005 | Lettvin ............. 382/100 |

FOREIGN PATENT DOCUMENTS

WO  WO 2005/008679  1/2005

OTHER PUBLICATIONS

Lin, et al, "Nanoscale optical imaging on an electroluminescent polymer by conducting atomic force microscopy," J. Vac. Sci. Technol. B. 19(1), 2001.*
Pingree, L.S.C; Kern, M.M.; Scott, B.J.; Marks, T.J., and Hersam, M.C.; Quantum Efficiency of Micron Scaled Organic Light Emitting Diodes Using Atomic Force Eectroluminesce Microscopy; TNS Letters (The Minerals, Metals & Materials Society) 2004.
Pingree, L.S.C; Scott, B.J.; Russell, M.T.; Marks, T.J. and Hersam, M.C.; Negative capacitance in organic light-emitting diodes; Applied Physics Letters 86, 073509, 2005.
Pingree, L.S.C.; Hersam, M.C.; Kern, M.M.; Scott, B.J. and Marks, T.J.; Spatialy-resolved electroluminescence of operating organic light-emitting diodes using conductive atomic force microscopy; Applied Physics Letters, vol. 85, No. 2, 2004.

* cited by examiner

*Primary Examiner*—Jack I. Berman
*Assistant Examiner*—Michael Maskell
(74) *Attorney, Agent, or Firm*—Reinhart Boerner Van Deuren sc

(57) ABSTRACT

A conductive atomic force microscopy (cAFM) technique which can concurrently monitor topography, charge transport, and electroluminescence with nanometer spatial resolution. This cAFM approach is particularly well suited for probing the electroluminescent response characteristics of operating organic light-emitting diodes (OLEDs) over short length scales.

20 Claims, 10 Drawing Sheets

Figure 1B
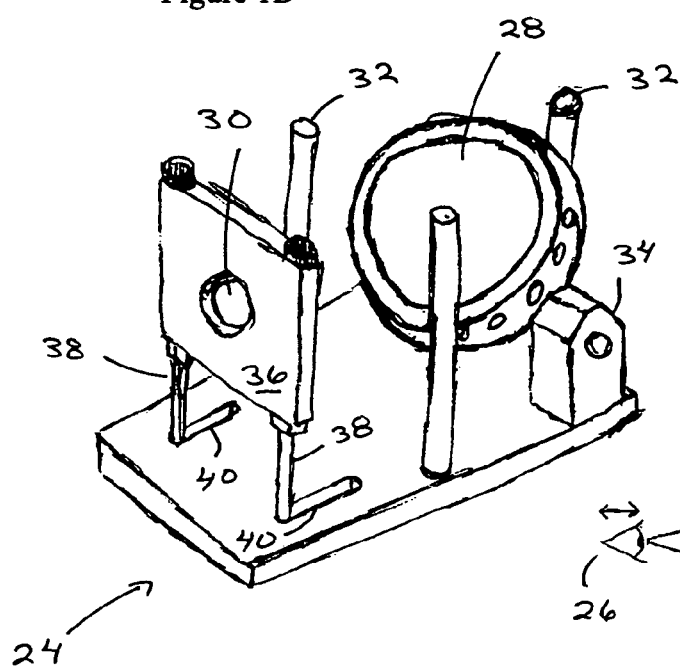
Figure 1C
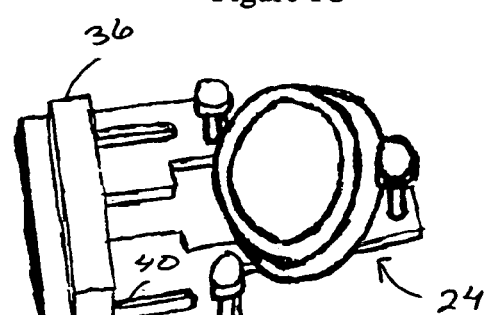
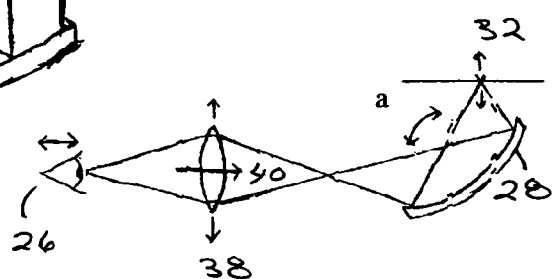
Figure 1D

Figure 2A
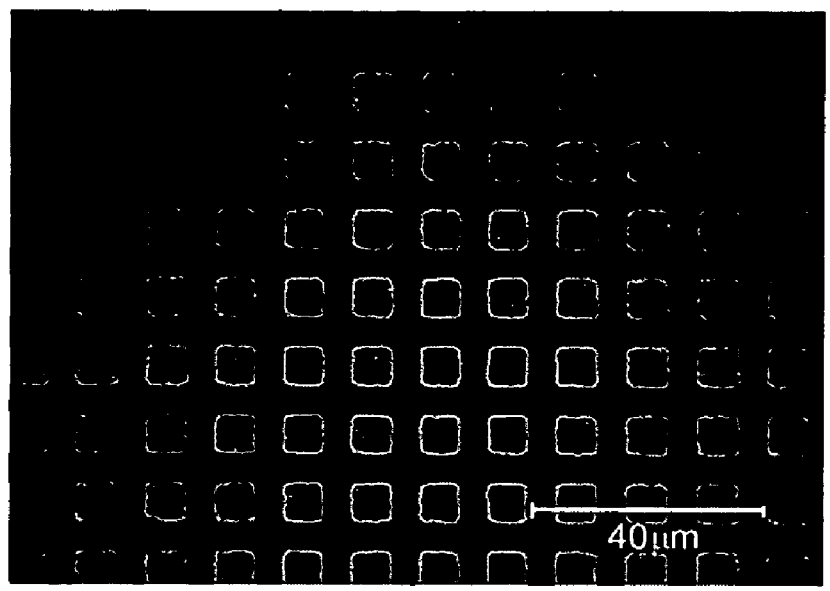
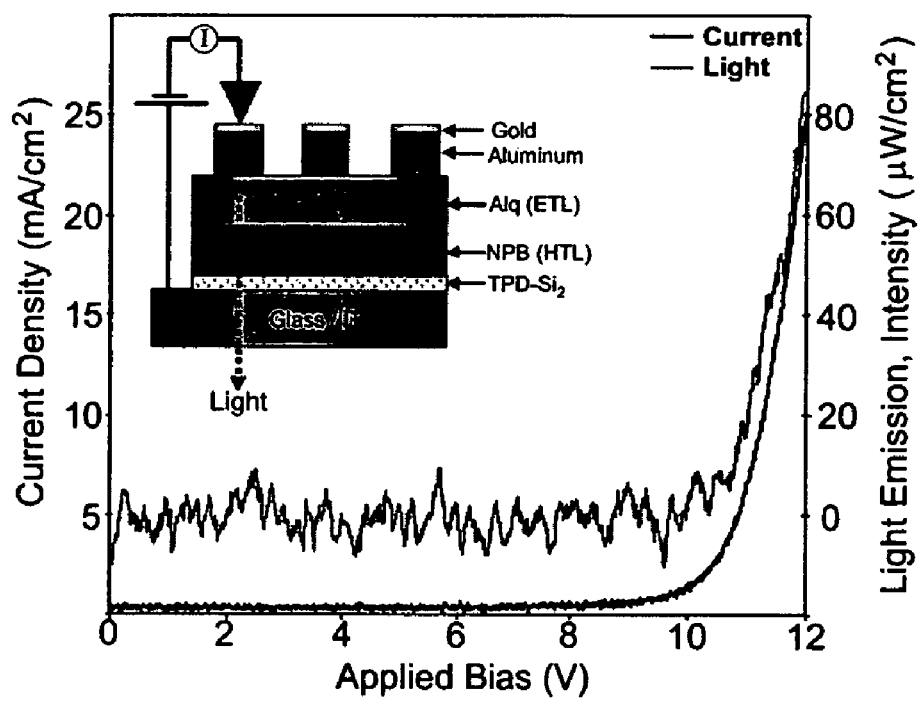
Figure 2B

Figure 3A
Figure 3B
Figure 3C
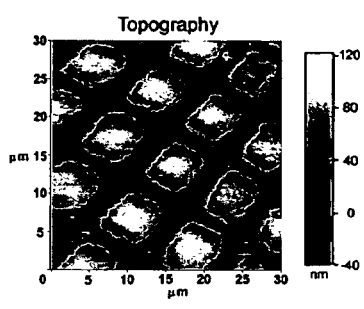
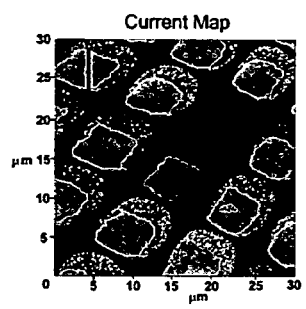
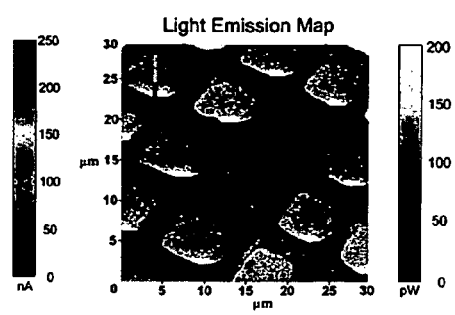

Figure 7A
Figure 7B
Figure 7C
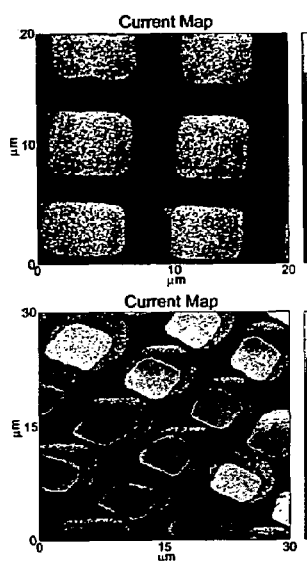
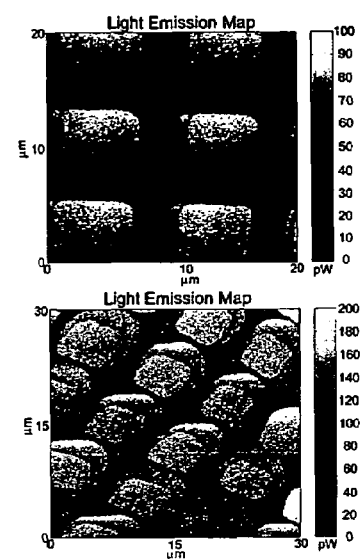
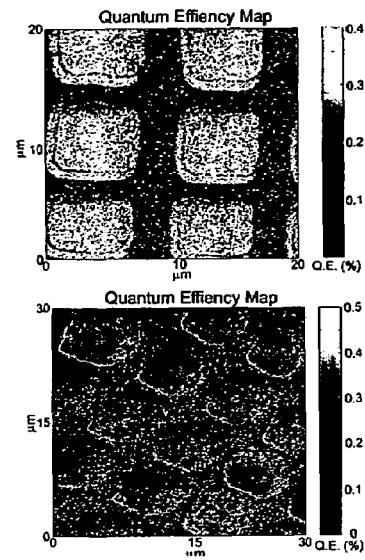
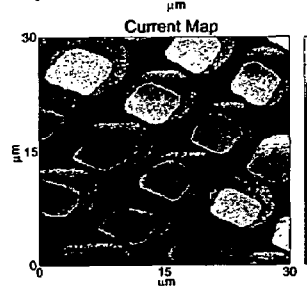
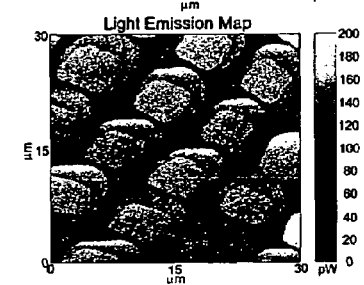
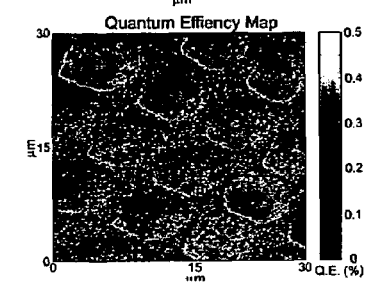
Figure 7D
Figure 7E
Figure 7F

METHODS AND APPARATUS OF SPATIALLY RESOLVED ELECTROLUMINESCENCE OF OPERATING ORGANIC LIGHT-EMITTING DIODES USING CONDUCTIVE ATOMIC FORCE MICROSCOPY This application claims priority benefit of U.S. application Ser. No. 60/575,653, filed May 28, 2004, the entirety of which is incorporated herein by reference.

The United States government has certain rights to this invention pursuant to Grant Nos. NCC2-1363 and DMR-0134706 from the NASA Institute of Nanoelectronics and Commuting and the National Science Foundation, respectively, to Northwestern University.

BACKGROUND OF THE INVENTION

Organic light-emitting diodes (OLEDs) have received increasing attention over the past decade due to their potential use in inexpensive, large area, high brightness, and flexible color displays. Of particular interest is the miniaturization of OLEDs as nanoscale light emitters would enable ultrahigh density displays and novel optoelectronic device architectures. However, as OLEDs approach shorter length scales, fabrication- and materials-dependent micro- and nanoscopic spatial variations in response may lead to significant device-to-device non-uniformities that compromise overall system performance. For example, a common spatially localized defect in OLEDs is the formation of poorly understood "dark spots" at various device locations which exhibit little or no electroluminescence. These dark spots have been reported to increase in size as a function of time, especially in the presence of moisture. To overcome these performance and reliability limitations, a better understanding of common OLED failure mechanisms is required.

Previous attempts to spatially map light emission from organic light-emitting materials include electroluminescence microscopy and near-field scanning optical microscopy (NSOM). In electroluminescence microscopy, light emission from operating OLEDs is detected with an optical microscope. Although this technique is effective at characterizing millimeter scale device features, its spatial resolution is inherently limited by the wavelength of the emitted light. While NSOM achieves sub-100 nm spatial resolution by detecting light in the near-field with a sub wavelength aperture in a fiber tip and has been widely used for characterizing photoluminescence in organic materials, its experimental geometry is not particularly well suited for detecting electroluminescence from operating OLEDs. Importantly, neither technique is capable of simultaneously probing topology, current-voltage response, and electroluminescence-voltage response at the nanoscale.

Atomic force microscopy is described generally in U.S. Pat. No. 6,642,517, the entirety of which—and, in particular, FIGS. 1-2, 4 and 6-7 and corresponding descriptions thereof and the references cited therein—is incorporated herein by reference. More specifically, conductive atomic force microscopy (cAFM) has recently proven to be an effective method for probing current flow and resistivity variations with nanometer scale spatial resolution in gold nanowires, silicon field effect transistors, individual organic molecules, conducting polymer blends, and emissive polymers. See, respectively: M. C. Hersam, A. C. F. Hoole, S. J. O'Shea, and M. E. Welland, *Appl. Phys. Lett.* 72, 915 (1998); P. De Wolf, W. Vandervorst, H. Smith, and N. Khalil, *J. Vac. Sci. Technol. B* 18, 540 (2000); A. M. Rawlett, T. J. Hopson, L. A. Nagahara, R. K. Tsui, G. K. Ramachandran, and S. M. Lindsay, *Appl. Phys. Lett.* 81, 3043 (2002); J. Planès, F. Houzé, P. Chrétien, and O. Schneegans, *Appl. Phys. Lett.* 79, 2993 (2001); and H. -N. Lin, H. -L. Lin, S. -S. Wang, L. -S. Yu, G. -Y. Perng, S. -A. Chen, and S. -H. Chen, *Appl. Phys. Lett.* 81, 2572 (2002).

Since the cAFM tip is used to locally inject charge, cAFM can directly stimulate electroluminescence with nanometer scale spatial resolution. With appropriate collection optics and photon detectors, the resulting electroluminescence can be spatially correlated with the cAFM tip position, thus enabling nanometer scale electroluminescence mapping. cAFM is described generally in U.S. Pat. No. 5,874,734, the entirety of which is incorporated hereby by reference. Thus, cAFM and analogous scanning tunneling microscopy measurements have been used to spatially map electroluminescence in a variety of organic materials. However, in these studies, the conductive tip was brought directly into contact with the organic material. While such direct electrical contact with the materials is sufficient to induce electroluminescence, a point contact of this type is inevitably different from the evaporated electrical contacts fabricated in actual OLED devices.

BRIEF DESCRIPTION OF THE DRAWINGS

FIGS. 1A-F. Non-limiting apparatus component configurations and illustrations for cAFM electroluminescence measurements.

FIG. 2. (A) Optical micrograph of an array of 8 μm×8 μm OLED pixels on a 12 μm pitch. (B) Plot of current density and light emission intensity as a function of applied bias. The light emission data is vertically offset for clarity. Data are gathered from a single 8 μm×8 μm OLED pixel using the cAFM electroluminescence apparatus. The inset schematically illustrates a cross-section of a representative OLED structure.

FIG. 3. Simultaneous topography (A), current (B), and light emission (C) maps of the OLED array gathered at an applied bias of 20 V and a set point force of 80 nN.

FIG. 7. Maps of (A) current, (B) LE, and (C) QE from simultaneously gathered AFEM data demonstrating uniformity. Additionally, maps of (D) current, (E) LE, and (F) QE from an electrically non-uniform area demonstrating continued uniformity in quantum efficiency.

SUMMARY OF THE INVENTION

Figure 1A:
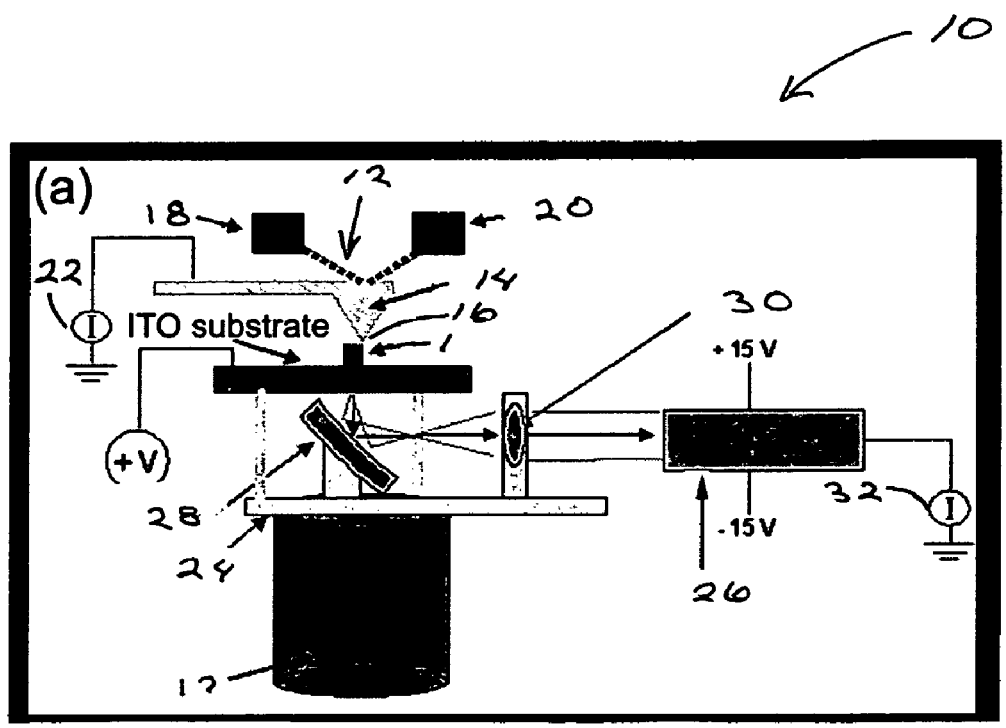

In light of the foregoing, it is an object of the present invention to provide one or more methods and/or apparatus for use in conjunction therewith to spatially-resolve electroluminescence of an operating organic light-emitting diode, thereby overcoming various deficiencies and shortcomings of prior art, including those outlined above. It will be understood by those skilled in the art that one or more aspects of this invention can meet certain objectives, while one or more other aspects can meet certain objectives. Each objective may not apply equally, in all its respects, to every aspect of this invention. As such, the following objects can be viewed in the alternative with respect to any one aspect of this invention.

It is an object of the present invention to provide a method and/or apparatus to evaluate operative OLED devices, after assembly and fabrication of associated electrode or contact components, as opposed to characterization of the optical properties of a constituent organic material.

It is another object of the present invention to provide a conductive atomic force microscopic technique to simultaneously image OLED device topography, current flow and light emission during device operation.

It is another object of the present invention to provide one or more methods in an associated apparatus configurations to analyze local response and failure processes associated with OLED pixel arrays.

Other objects, features, benefits and advantages of this invention would be apparent from the summary, in conjunction with the following descriptions of certain embodiments, and will be readily apparent to those skilled in the art having knowledge of various conductive atomic force microscopic techniques, electroluminescent devices in performance criteria. Such objects, features, benefits and advantages will be apparent from the above as to taken into conjunction with the accompanying examples, data, figures and all reasonable inferences to be drawn therefrom, alone or with consideration of the references incorporated herein.

In part, this invention can be directed to a method of using conductive atomic force microscopy for spatially-resolving the electroluminescence of an organic light-emitting diode. Such a method can comprise (1) providing an operative OLED device comprising an anode, a cathode and at least one emissive organic component therebetween; (2) contacting one of the device electrodes with a conductive atomic force microscope comprising a current conductive cantilever tip; (3) applying a voltage bias across the device; and (4) correlating electroluminescence in various aspects thereof with position of the conductive tip on the device.

In certain embodiments, the conductive tip can be at a fixed position on one of the electrodes with applied bias varied, to detect light emission intensity and current density. In various other embodiments, the device can be scanned with an applied bias, for topographical mapping. Alternatively, in such embodiments, light emission intensity and current density can be mapped simultaneously with device topography. In yet another embodiment, a pixel or a pixel array of such a device can be analyzed with a bias applied thereacross, to assess interdevice properties or changes therein over time. Accordingly, spatial variations of quantum efficiency can be correlated with light emission.

In part, this invention can also be directed to a conductive atomic microscope apparatus to spatially-resolve electroluminescence from an OLED device. Such an apparatus can comprise (1) an optics component comprising a bi-convex lens arranged and configured to direct light emitted from the OLED device; and (2) a photomultiplier component aligned with the optics component for light detection and analysis. As would be understood by those skilled in the art familiar with atomic force microscopy, a photomultiplier component of this invention can be configured peripheral to an apparatus scanner. Alternatively, as described herein, such a photomultiplier component can be vertically aligned with such a scanner. Regardless, a photomultiplier component can be coupled to an inverted optical microscope, for use as described more fully below.

Accordingly, this invention can also provide a method of operating a conductive atomic force microscope. Such a method can comprise (1) providing an operative OLED device comprising an anode, a cathode and at least one emissive organic component therebetween; (2) contacting one of the device electrodes with a conductive atomic force microscope apparatus comprising a current conductive cantilever tip and scanner component; (3) focusing light emitted from the device; and (4) amplifying emitted light with a photomultiplier component. With measurement of current flow through a conductive tip, quantum efficiency can be calculated. With use of a photomultiplier component, the electroluminescence of an OLED device can be detected with the same spatial resolution typically associated with conductive atomic force microscopy. Various other aspects relating to apparatus operation can be associated therewith, including analysis of the optical and electric spectra of the emitted light.

Without limitation, a novel aspect of this invention resides in the ability to detect electroluminescence of a material with 10 nm precision, whereas other techniques have probed only photoluminescence with 100 nm resolution or quantitative variations in electroluminescence of large scaled (millimeter sized) devices with 250 nm resolution. As a result and as demonstrated below, the present invention provides a novel cAFM apparatus and methodology that simultaneously images topology, current flow, and light emission in operating OLEDs with nanometer scale spatial resolution. This ability to address individual OLEDs at this length scale presents a unique opportunity to analyze local response and failure processes in OLED pixel arrays. Furthermore, as prototype nanoscale OLEDs are fabricated, this strategy will allow straightforward electrical and optical evaluation. The generality and flexibility of this technique also suggests that it will serve as an effective means for characterizing electroluminescence from semiconducting nanowires, nanotubes, and numerous other sub-micron optoelectronic devices that would otherwise be difficult to address directly with large-scale probing devices.

DETAILED DESCRIPTION OF CERTAIN EMBODIMENTS

A schematic of an apparatus 10, in accordance with this invention, is illustrated in FIG. 1A. Scanning can be accomplished under ambient conditions, using a commercially-available cAFM 12, modified as described herein. More specifically, a conventional cantilever beam deflection component 12 detects deflection of probe assembly 14 as conducting tip 16 interacts with a surface of an OLED device. Sample 1 (e.g., an OLED device) is mounted on a piezotube scanner component 17 to allow apparatus 10 for scanning. Apparatus 10 includes a laser 18 for directing the beam of light toward cantilever 12 which, during operation, reflects the laser toward photodetector 20. As understood in the art, apparatus 10 then measures the position of the defective light beam which is indicative of the deflection of cantilever 12 which, in turn, is a measure of the reaction force between tip 14 and the device surface. More specifically to the apparatus of FIG. 1A, a positive bias can be applied while tip 16 is connected to current preamplifier 22 acting as a virtual ground.

In one embodiment, an optics stage 24 (e.g., FIG. 1A) is designed to focus light from bottom-emitting OLEDs into the aperture of a photomultiplier tube PMT 26. The stage has multiple degrees of freedom that allow the light collection efficiency and focusing to be optimized. To provide tilt and out-of-plane angle adjustments on the optics stage, a 6 mm diameter concave mirror 28 was mounted directly below the device at a 45° angle from the plane of the sample, with a focal length of 6 mm. A 6 mm diameter bi-convex lens 30 with a focal length of 6 mm was positioned in front of the mirror. In order to re-focus the emitted light into the aperture, the position of the lens is manually adjusted on the base of stage 24. The stage has a mass (e.g., only 4.6634 g in one embodiment) to avoid adverse effects in the response of the scanning piezotube. Spurious light from the AFM cantilever deflection laser (e.g., 632 nm) and other extraneous light sources can be removed using high pass (e.g., 500 nm) and low pass (e.g., 600 nm) filters fitted directly in front of the PMT aperture, as more fully discussed below.

PMT 26 is connected to current preamplifier 32 to quantify electroluminescence; i.e., current density and light emission intensity. To minimize PMT noise, the low pass rise time filter of preamplifier 32 was set at 1 ms, and the gain of PMT 26 was controlled using an external DC voltage supply connected to a 400 Hz low-pass filter. To allow light emission and current data to be recorded concurrently with topographical data gathered through the AFM, the output voltages from both preamplifiers were fed into the signal access module (SAM) of the AFM 10. The efficiency of light-gathering from the sample stage was determined to be approximately 2% through the use of a light source of known intensity. This low efficiency is accounted for given the limited adjustment capability of optics stage 24. To confirm operation and calibrate the optical detection system, a green inorganic LED with known output optical power was tested in the optics stage preceding OLED characterization. During electroluminescence mapping, light emission and current data are recorded concurrently with topographical data by monitoring the output voltages from both current preamplifiers with independent analog to digital converters.

Referring to FIG. 1B, optics stage 24 can comprise a configuration of one or more posts 32 for support of a sample/device above concave mirror 28. Post 34 adjustably mounts mirror 28 to stage 24 to allow for mirror tilt and out-of-plane adjustment. Reflected light is focused by convex lens 30 mounted in lens holder 36, allowing for both vertical adjustment along frame posts 38 and horizontal adjustment along slots 40. Such components can also be used in conjunction with an alternate configuration of stage 24, an elevated perspective view of which is provided in FIG. 1C. Regardless, light focus and collection mechanisms associated with such a stage component are schematically illustrated in FIG. 1D. For instance, vertical adjustment along posts 32 and orientation of angle a of mirror 28 directs light toward lens 30, adjusted vertically along frame posts 38 and horizontally along slots 40. PMT component 26 can be adjustably positioned at the focal length of lens 30 for efficient, maximum light collection.

It should be noted that implementation of the methodologies and techniques of this invention are not restricted to the specific components recited herein. Likewise, various other apparatus configurations can be used, as would be understood by those skilled in the art made aware of this invention. For instance, hardware improvements can be made to increase the quality of the measurements and reduce noise. A PMT with higher gain and lower dark current, as well as improvements to the optics stage, would drastically reduce the losses-leading to an increase in the signal-to-noise ratio, allowing this technique to reach its theoretical limit, namely light detection from a 10 nm×10 nm device.

Figure 1E:
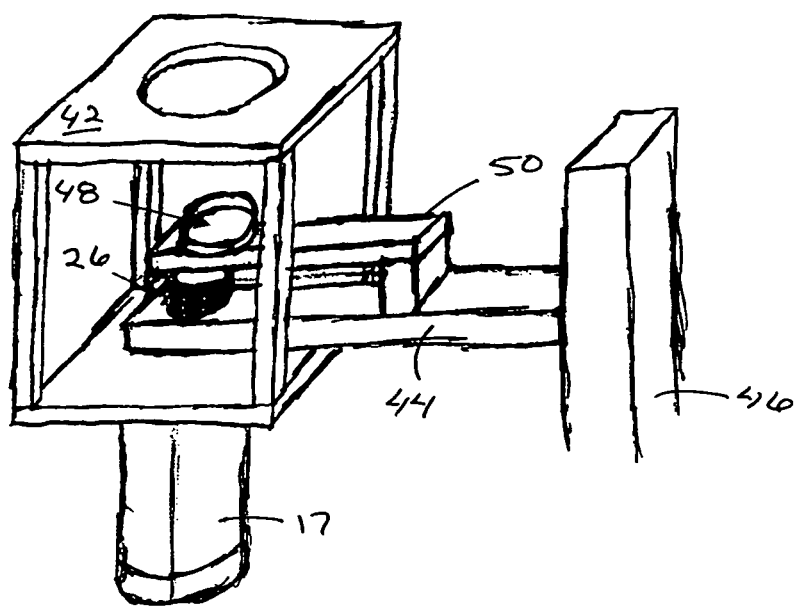

With regard to improved signal-to-noise ratios, the PMT and associated filters can be positioned directly beneath the OLED device but above the scanner, avoiding adverse effects on the scanning motion of the piezotube. In addition, photon-counting electronics can be used to minimize the adverse effects of shot-noise by discriminating the pulse-size of the signal arriving at the anode of the PMT. A schematic of such a configuration is illustrated in FIG. 1E. The OLED sample is supported above photomultiplier component 26 by hollow sample stage 42, allowing for the sample to be scanned, while component 26 is externally supported. Sample/device 1 can be situated in conjunction with (e.g., an aperture of) hollow optics stage 42, positioned above scanner 17. PMT 26 is positioned along arm 44 with vertical support 46. Optical filters (e.g., low and high pass filters 48) can be positioned above PMT 26 by support component 50. In such a configuration, optical filters can block out laser light from the AFM deflection detection circuit. As known in the art, a Peltier cooler can be attached to the copper arm to cool PMT 26 during operation.

Another alternate configuration (e.g., FIG. 1F) allows for the collection of light through the objective lens of an inverted optical microscope, which can be coupled to a photon discriminating PMT. Likewise, such a system or apparatus can include the use of a spectrophotometer, such as an Optical Spectrum Analyzer (OSA), to determine variations in the wavelength of the emitted light attributable to potential quantum scaling effects. Geometrical constraints and inherent losses of a fiber-optic coupler required to input the emitted light into an OSA can be overcome with such a configuration. Additionally, introduction of an OSA to a cAFM apparatus can enable the advanced chemical discrimination required for biological applications.

Figure 1F:
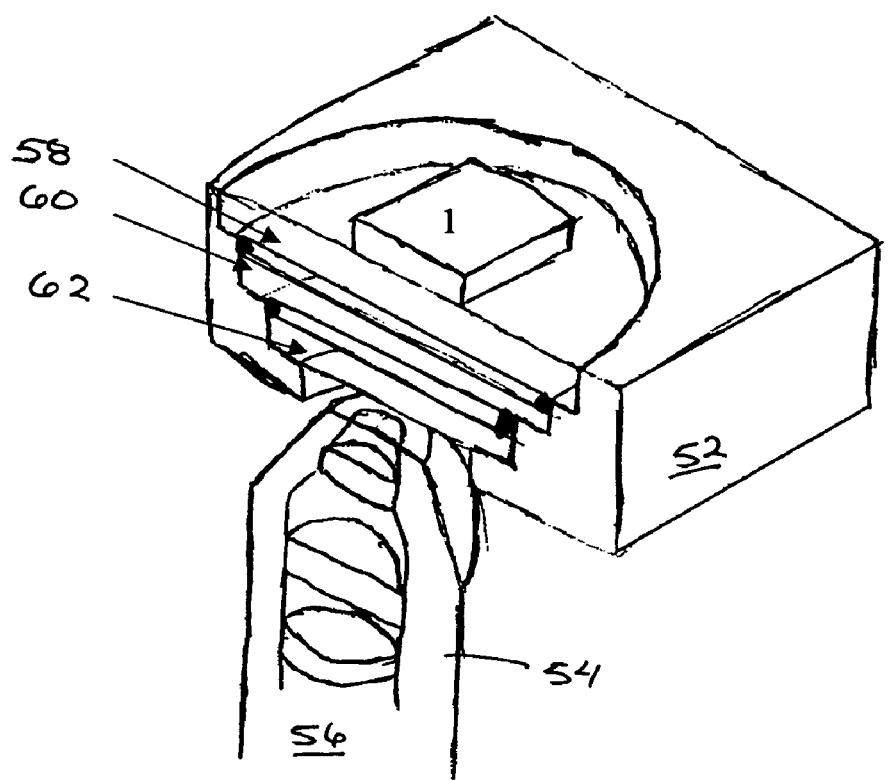

With further reference to FIG. 1F, sample/device 1 can be positioned over objective lens 54 of optical microscope 56. A PMT can then be located along the optical line of microscope 56. To limit the effects of light at wavelengths less that those being measured and improve light harvest, high-pass optical filter 58 can be installed between the OLED sample and the objective lens of an optical microscope. In addition, adverse effects of a laser used for force sensing can be filtered out through the use of a low pass filter 60. To improve the collection efficiency, convex focusing lens 62 can be placed directly below the sample. The sample can be attached to the apparatus through a stainless steel sample holder clip 8, on the planer side of focusing lens 60. A configuration such as that illustrated in FIG. 1F can be employed with a tip scanning cAFM. Other designs and configurations, in accordance with this invention, can be implemented with a sample scanning cAFM.

Using the configuration of FIG. 1F, the light emitted from the device can be monitored by both an OSA and PMT simultaneously, yielding spatially dependent information about the wavelength of the emitted light. The intensity, phase shift and AC magnitude of the emitted light through both can be analyzed as known in the art, using for instance a lock-in amplifier and spectrum analyzer. A second spectrum analyzer may be useful, as the optical spectrum analyzer provides information on the wavelength of emitted light, and the electrical spectrum analyzer can monitor for harmonic effects in the emitted light due to an applied alternating current bias.

An apparatus of this invention can be assembled and configured as would be understood by those skilled in the art, with components commercially available and used in conjunction with various other cAFM applications. See, e.g., the apparatus/component configurations provided in the aforementioned references. For instance, cAFM measurements can be made with Nanosensors boron-doped, diamond-coated silicon tips and cantilevers (force constant=1.8 N/m, resistivity<0.1 Ω-cm). Diamond-coated probes were chosen to minimize tip wear during contact mode imaging. See, Ph. Niedermann, W. Hänni, N. Blanc, R. Christoph, and J. Burger, *J. Vac. Sci. Technol.* A 14, 1233 (1996). The current through the cAFM probe can be detected with a DL Instruments 1212 current preamplifier. Optics stage weights of the sort described above can be achieved by fabricating the stage from low-density polyethylene, polycarbonate, and Teflon® fasteners. A Hamamatsu PMT (model number H6780-00) connected to a DL Instruments 1211 current preamplifier can be used to quantify light emission.

Apparatus and methods of this invention are particularly well suited for probing the electroluminescent properties of operating organic light emitting diodes, as illustrated in the following examples by spatially and temporally varying electroluminescent properties of two dimensional arrays of 8 μm×8 μm OLED pixels. Likewise, the quantum efficiency (QE) of similar OLEDs can be spatially resolved. In addition, this invention allows for efficient statistical analysis of the current, light emission, and quantum efficiency of these devices. Compared to light emission and current, the standard deviation of the QE was found to be significantly attenuated. This further illustrates one of the unique strengths of the technique: that a statistically significant quantity of data can be gathered very rapidly with limited sample quantities and minimal equipment requirements. Previously in the art, 75+ samples would need to be prepared to gather a similar quantity of data, whereas, here, comparable data can be gathered from only 4 samples, with repeat experiments to achieve improved statistics. In addition, such experiments can be repeated in a matter of a few hours, rather than days; drastically decreasing quality control type measurements and introducing an efficient new method for quality control tests for industrial settings. Another advantage relates to the ability to gather such data in a small region, yielding information on local variations in the device properties which could not have been obtained using standard techniques and device sizes.

EXAMPLES OF THE INVENTION

The following non-limiting examples and data illustrate various aspects and features relating to the apparatus and/or methods of the present invention, including the use of conductive atomic force microscopy in the analysis and evaluation of fabricated OLED devices, as described herein. In comparison with the prior art, the present methods and apparatus provide results and data which are surprising, unexpected and contrary thereto. While the utility of this invention is illustrated through the use of several apparatus configurations and component assemblies, it will be understood by those skilled in the art that comparable results are obtainable with various other apparatus, components and configurations, as are commensurate with scope of this invention.

Example 1

OLEDs were fabricated according to the following procedure. Indium tin oxide (ITO) glass slides with a sheet resistance of <30 Ω/cm from Thin Film Devices were cleaned according to a literature procedure. See, W. J. Li, Q. W. Wang, J. Cui, H. Chou, S. E. Shaheen, G. E. Jabbour, J. Anderson, P. Lee, B. Kippelen, N. Peyghambarian, N. R. Armstrong, and T. J. Marks, *Adv. Mater.* 11, 730 (1999). Interfacial monolayers of TPD-$Si_2$ (4,4'-bis[(p-trichlorosilyl propylphenyl)phenylamino]-biphenyl) were then self-assembled in dry toluene (0.25 mg/mL) onto the ITO surface for 1 hr at 85° C., followed by rinsing with toluene and curing at 120° C. The hole transport material α-NPB (N,N'-di(α-naphthyl)-N,N'-diphenyl-1,1'-biphenyl-4,4' diamine) and the electron transport/emissive material Alq (tris(8-hydroxyquinalato)aluminum (III)) were purified by gradient sublimation prior to use. The NPB and Alq layers were subsequently deposited by thermal evaporation (1.5-2.0 Å/s) to a thickness of 25 nm and 30 nm, respectively, at a base pressure of $10^{-7}$ Torr. The cathodes consisted of a 60 nm aluminum layer (Aldrich, 99.999%) followed by a 12 nm passivating gold layer, deposited thermally at 1.5 Å/s and 0.3 Å/s, respectively. The 8 μm×8 μm cathode dimensions were defined using a stencil mask consisting of a 2000-mesh copper transmission electron microscopy grid (Ted Pella, Inc.). Due to slight variations in cathode source location during evaporation of the aluminum and gold, these metal layers are slightly misaligned or offset. This offset appears to have a negligible effect on device performance at this size scale.

Example 2

FIG. 2(A) presents an optical micrograph of the completed OLED pixel array, while the inset to FIG. 2(B) shows a schematic cross-section of the devices. This sample was subsequently mounted in the cAFM electroluminescence apparatus of FIG. 1 for testing. Following preliminary topographic imaging at zero applied bias, the cAFM tip was positioned over an individual OLED pixel. With the cAFM tip position held fixed in contact with the top gold electrode, the applied bias was swept (from 0 to 12V over 5 seconds) while the current and light emission were recorded as shown in FIG. 2(B). (A moving average of 10 points was applied to the light output data due to PMT noise. 1000 points were taken during the sweep.) The recorded current density, light emission intensity, and external quantum efficiency as well as their dependence on voltage agree well with previously reported measurements on comparable millimeter scale OLED structures. (The external quantum efficiency for the device is calculated to be ca. 0.5%, which is comparable to millimeter-scale OLEDs of a similar structure. The turn-on voltage for current and light emission is 3.5 V and 9.0 V, respectively, which compares well with millimeter size device behavior.)

Example 3

In addition to recording current-voltage and electroluminescence-voltage curves on individually addressed OLED pixels, a cAFM electroluminescent technique of this invention is well suited for spatially mapping charge transport and photon emission at a fixed applied bias. To demonstrate this capability, simultaneous topography, current, and light emission images were acquired on the OLED pixel array at an applied bias of 20 V as depicted in FIG. 3. The scan rate was 1 Hz, and applied force was 80 nN. In 3A the waviness is due to the additional inertia caused by the extreme height of the sample on top of the optics stage. In 3B and 3C the discontinuity in the gold surface of one of the devices is most likely due to the introduction of a dust particle to the chamber during device fabrication. Several observations can be made from these images. First, the offset between the aluminum and gold cathode layers is clearly evident and can be precisely measured. Quantification of this offset is useful for response optimization in OLED pixel fabrication. Furthermore, the offset illustrates the effect of the passivating gold top contact for this measurement. In particular, in the upper right corner of each device where the aluminum cathode is not passivated with the gold top contact, the current flow and light emission are attenuated, perhaps due to a less than optimal tip-sample electrical contact arising from aluminum oxidation.

Example 4

FIG. 3 also illustrates clear spatial variations in the electroluminescence. Although the OLED pixels were fabricated using standard procedures and all nominally have the same structure, the magnitude of the current and the photon emission differs significantly from pixel to pixel. One possible interpretation of these data is that dark spots have formed on the sub-10 µm length scale. Interestingly, the pixels with attenuated photon emission also show reduced current flow, thus demonstrating that the reduced photon emission cannot be solely attributed to a local reduction in external quantum efficiency, but rather to variations in growth conditions.

Example 5

Figure 4:
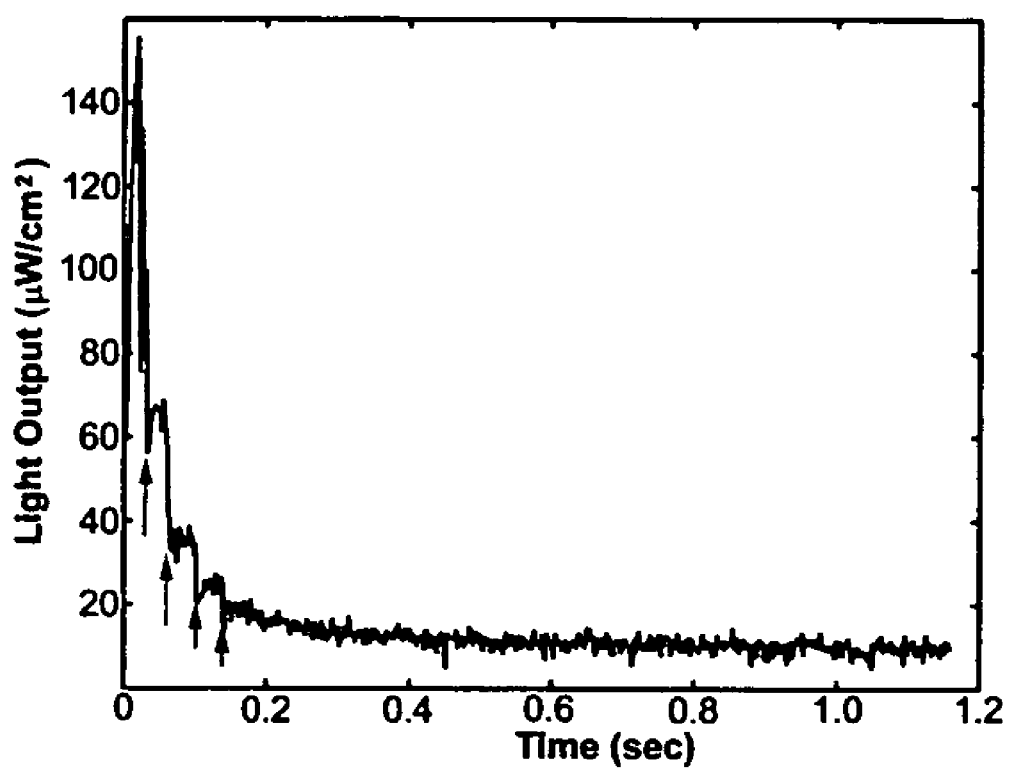
FIG. 4. Plot of time-dependent behavior of a device in FIG. 4, for a constant applied voltage of +20 V. The arrows represent subsequent scan lines for the first 4 lines. There is typically a large decay in electroluminesence with subsequent rapid turn-ons as signified in the plot by the region directly above each arrow. Once behavior steadies, however, subsequent turn-ons do not appear to cause further degradation as seen in this figure for times >200 ms.

In early OLED work, it was reported that the initial behavior of OLEDs is not stable; this instability is represented in the sharp peaks in both the current (FIG. 3B) and light emission (FIG. 3C) maps on the lower corner of each of the devices. The position of this peak is due to the bottom-to-top direction of the scan, and similarly, a top-to-bottom scan shows peaks on the upper edges of the diodes. The initial behavior lasts for approximately 0.4 seconds, which is apparent in FIG. 4. This representation of device lifetime data has previously been impossible, demonstrating additional novelty of this invention. FIG. 4 has been reconstructed from FIG. 3C for one device and displays the cumulative lifetime for an individual diode by reconstructing the data for each device one pixel at a time. The time axis is determined by the scan rate, the image size, and the number of pixels gathered (one line per second and 256×256 pixels per image).

Example 6

Figure 5:
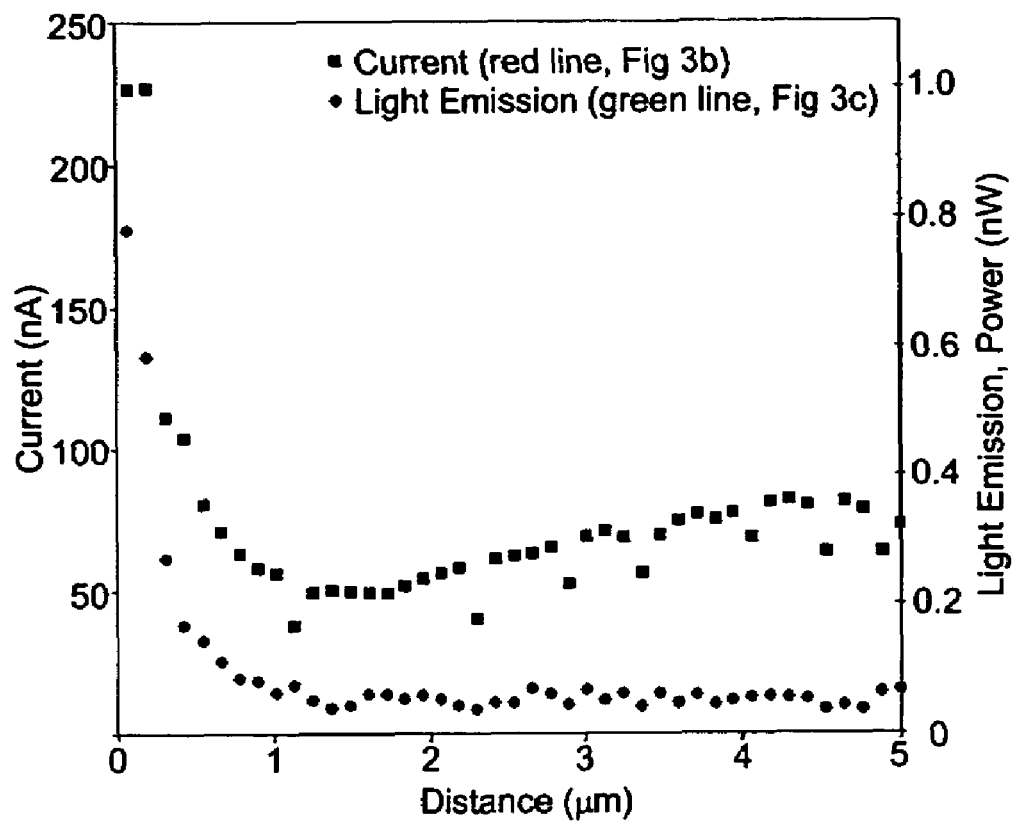
FIG. 5. Line plots of the current and light emission across one of the OLED pixels marked in FIG. 3.

Besides device-to-device non-uniformities, clear response variations are observed even within a given OLED. To better illustrate this intra-device behavior, line plots of the current and photon emission for a single OLED are shown in FIG. 5. In these images, the cAFM tip is being raster scanned with the slow scan direction oriented from the bottom to the top of the image. Consequently, the bottom of the devices represents the initial device response. As shown in the line plots, initial device behavior degrades rapidly and reaches steady state after approximately 1 µm, which corresponds to 8 scan lines. Initial OLED degradation of this type is consistent with previous reports over larger length scales and illustrates that the cAFM electroluminescence technique not only provides spatially dependent information but also device temporal characteristics. For example, as the device is subsequently scanned following initial degradation, it is clear from FIG. 4 that the current increases while the light emission remains relatively constant, clearly revealing decline in local external quantum efficiency.

Example 7

With OLED devices fabricated as described in Example 1, by collecting LE data and current data simultaneously, the spatial variations of QE of OLEDs can also be discerned. Using cAFM, QE maps can be correlated with LE and current maps to assess decreased regions of LE (e.g., dark spots) in OLED devices.

Using an applied bias of 14 volts, spatially resolved LE and current data on OLED pixel arrays were gathered both in ambient conditions and in a dry nitrogen environment. Spurious effects of Al cathode oxidation were limited by the addition of a passivating gold layer. (Again, however, slight variations in position of the evaporation sources during fabrication cause a slight offset in the metallic layers, as seen in FIG. 7.)

To determine the distribution of device-to-device variations in current, LE, and QE, the data was averaged over each OLED pixel for both light and current. The calculation of QE was then performed using these average values. To determine the spatial variations in QE, however, each data point collected during the scanning process was used to calculate the spatially resolved QE. For comparison purposes, the data sets were normalized such that the mean was set to unity. Standard deviations were calculated from these normalized values.

Example 8

Figure 6:
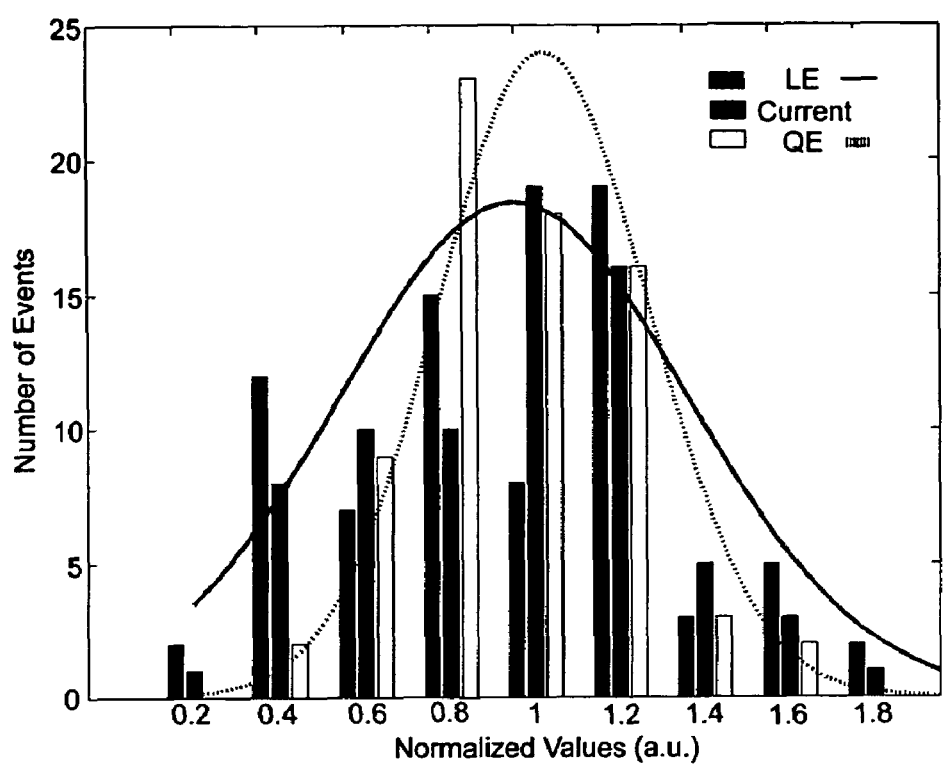
FIG. 6. (Bars) Normalized distribution of LE, current, and QE for 74 OLEDs. (Lines) Standard normal distribution curves for LE and QE. Distributions are offset to align with corresponding Bars.

FIG. 6 presents the normalized histogram of current, LE, and QE over 74 OLEDs. In addition, fitted Gaussian distribution functions are included for LE and QE data. The normalized standard deviations are 0.44 for LE, 0.33 for current, and 0.24 for QE. The reduced standard deviation for QE suggests that although large device-to-device deviations exist in LE, these apparent dark spots can be attributed to variations in charge transport as opposed to local QE fluctuations.

Example 9

FIG. 7 displays two sets of simultaneously gathered current, LE, and QE maps. FIGS. 7(A-C) were gathered in a dry nitrogen atmosphere, and minimal device-to-device variation is observed. Since the slow scan direction was from the top to the bottom of the image, the data at the top of each device represents the initial turn on device behavior. During this initial transient period, the current and LE are enhanced. However, in FIG. 7(C) the QE is slightly attenuated over this same period. This subtle transient effect may be attributed to charge carriers being initially diverted from the NPB/Alq$_3$ interface to fill trapping states in the device, thus rendering them unavailable for exciton creation. Besides this transient behavior, however, the QE experiences minimal spatial variations across the OLED pixel array.

FIGS. 7(D-F) were gathered near the edge of an array in ambient conditions, where device performance typically degrades rapidly. FIGS. 2(D) and 2(E) demonstrate clear non-uniformities in current and LE. However, in FIG. 2(F), the QE remains relatively constant. This QE spatial map suggests that the degradation of LE is not due to decreases in QE, but rather can be attributed to local reductions in charge transport.

As can be inferred from the preceding, the apparatus, methods and techniques of this invention can be extended to various other applications. Issues surrounding the nucleation and growth of dark spots in OLEDs could benefit by further decreasing device size and subsequently mapping local variations in device electroluminescence. Studies of time-dependent behavior will also provide insight into nucleation and dark spot growth. Furthermore, the size parameters accompanying this invention allow other variables to be addressed. For instance, large-scale cathode delamination will be limited to individual devices, and the buildup of trapped gasses resulting from electrode size and diffusion length pathways will be greatly reduced. Likewise, the present methods of apparatus can be used to characterize individual pixels of an OLED display device prior to the patterning of interconnects and product assembly. In this manner, defective material and/or components can be advantageously discarded, before device fabrication and packaging, with savings of time and cost. In a similar fashion, this invention can be used to ensure uniform material and film properties prior to assembly, thereby enabling a more rapid rate of device testing, improving device and accelerating the time to market associated with newly fabrication techniques. As would be understood by those skilled in the art, this invention can also provide one or more methods for measurement of electroluminescence from nanowires, nanotubes, lithographically patterned nanoLEDs or any sub-micron electrode device currently inaccessible by large scale probing apparatus.

We claim:

1. A method of using conductive atomic force microscopy for spatially-resolved electroluminescence of an organic light-emitting diode, said method comprising:
    providing an operative organic light-emitting diode device comprising an anode, a cathode and at least one emissive organic component therebetween;
    contacting one of said device electrodes with a conductive atomic force microscope, said microscope comprising a current conductive cantilever tip;
    applying a bias across said device; and
    correlating electroluminescence with tip position on said device.

2. The method of claim 1 wherein said tip is at a position on one of said electrodes and said bias is varied.

3. The method of claim 2 wherein light emission intensity and current density are detected as a function of applied bias.

4. The method of claim 1 wherein said bias is applied over the surface of one of said device electrodes.

5. The method of claim 1 wherein said device is topographically mapped.

6. The method of claim 4 wherein light emission intensity and current density are mapped simultaneously with said device topography.

7. The method of claim 1 wherein said device comprises a pixel and said bias is applied across said pixel.

8. The method of claim 7 wherein light emission intensity and current density are detected as a function of distance.

9. The method of claim 1 wherein said bias is applied over the surface of said device.

10. The method of claim 9 wherein spatial variations of quantum efficiency are correlated with light emission.

11. A conductive atomic force microscope apparatus to spatially-resolve electroluminescence of a diode device, said apparatus comprising:
    a probe comprising a current conductive cantilever tip;
    an optics component opposite said cantilever tip, said component comprising a bi-convex lens arranged and configured to direct light emitted from a diode device; and
    a photomultiplier component aligned with said cantilever tip and said optics component for light detection.

12. The apparatus of claim 11 wherein said photomultiplier component is peripheral to an apparatus scanner.

13. The apparatus of claim 11 wherein said photomultiplier component is vertically aligned with an apparatus scanner.

14. The apparatus of claim 11 wherein said photomultiplier component is coupled to an inverted optical microscope.

15. The apparatus of claim 14 comprising a spectrophotometer to determine emitted light wavelength.

16. A method of operating a conductive atomic force microscope to spatially-resolve electroluminescence, said method comprising:
    providing an operative organic light-emitting diode device comprising an anode, a cathode and at least one emissive organic component therebetween;
    contacting one of said device electrodes with a conductive atomic force microscope apparatus, said apparatus comprising a current conductive cantilever tip and a scanner component;
    focusing light emitted from said device; and
    amplifying said light with a photomultiplier component.

17. The method of claim 16 comprising measurement of current flow through said tip and calculation of device quantum efficiency.

18. The method of claim 16 wherein said photomultiplier component is positioned between said device and said scanner component.

19. The method of claim 16 wherein said emitted light is focused through an inverted optical microscope.

20. The method of claim 19 comprising analysis of optical and electrical spectra of said emitted light.

* * * * *

UNITED STATES PATENT AND TRADEMARK OFFICE
CERTIFICATE OF CORRECTION

PATENT NO.        : 7,358,490 B1
APPLICATION NO. : 11/138148
DATED             : April 15, 2008
INVENTOR(S)       : Mark C. Hersam and Liam S. C. Pingree Page 1 of 1

It is certified that error appears in the above-identified patent and that said Letters Patent is hereby corrected as shown below:

On the Title Page Item (54)
Title: "METHODS AND APPARATUS OF SPATIALLY RESOLVED ELECTROLUMINESCENCE OF OPERATING ORGANIC LIGHT-EMITTING DIODES USING CONDUCTIVE ATOMIC FORCE MICROSCOPY"

should be

-- METHODS AND APPARATUS FOR SPATIALLY RESOLVED ELECTROLUMINESCENCE OF OPERATING ORGANIC LIGHT-EMITTING DIODES USING CONDUCTIVE ATOMIC FORCE MICROSCOPY --

Signed and Sealed this

Third Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,358,490 B1  
APPLICATION NO. : 11/138148  
DATED : April 15, 2008  
INVENTOR(S) : Mark C. Hersam and Liam S. C. Pingree Page 1 of 1

It is certified that error appears in the above-identified patent and that said Letters Patent is hereby corrected as shown below:

On the Title Page Item (54) and Column 1, lines 1-5  
Title: "METHODS AND APPARATUS OF SPATIALLY RESOLVED ELECTROLUMINESCENCE OF OPERATING ORGANIC LIGHT-EMITTING DIODES USING CONDUCTIVE ATOMIC FORCE MICROSCOPY"

should be

-- METHODS AND APPARATUS FOR SPATIALLY RESOLVED ELECTROLUMINESCENCE OF OPERATING ORGANIC LIGHT-EMITTING DIODES USING CONDUCTIVE ATOMIC FORCE MICROSCOPY --

This certificate supersedes the Certificate of Correction issued February 3, 2009.

Signed and Sealed this

Twenty-fourth Day of February, 2009

JOHN DOLL  
*Acting Director of the United States Patent and Trademark Office*